United States Patent [19]
Kanuma

[11] Patent Number: 5,077,740
[45] Date of Patent: Dec. 31, 1991

[54] LOGIC CIRCUIT HAVING NORMAL INPUT/OUTPUT DATA PATHS DISABLED WHEN TEST DATA IS TRANSFERRED DURING MACROCELL TESTING

[75] Inventor: Akira Kanuma, Yokohama, Japan

[73] Assignee: Kabushiki Kaisha Toshiba, Kawasaki, Japan

[21] Appl. No.: 303,232

[22] Filed: Jan. 30, 1989

[30] Foreign Application Priority Data

Jan. 29, 1988 [JP] Japan .................................. 63-17436

[51] Int. Cl.$^5$ .......................................... G01R 31/28
[52] U.S. Cl. .................................................. 371/22.3
[58] Field of Search .............................. 371/22.3, 22.4

[56] References Cited

U.S. PATENT DOCUMENTS

| | | | |
|---|---|---|---|
| 4,503,386 | 3/1985 | DasGupta et al. | 371/22.3 |
| 4,710,931 | 12/1987 | Bellay et al. | 371/22.3 |
| 4,817,093 | 3/1989 | Jacobs et al. | 371/22.3 |
| 4,897,837 | 1/1990 | Ishihara et al. | 371/22.3 |
| 4,910,734 | 3/1990 | Segawa et al. | 371/22.3 |

OTHER PUBLICATIONS

Eichelberger et al., "A Logic Design Structure for LSI Testability", Proc. Design Automation Workshop 14th (1977), pp. 462-468.

*Primary Examiner*—Charles E. Atkinson
*Attorney, Agent, or Firm*—Foley & Lardner

[57] ABSTRACT

A logic circuit having a plurality of macrocells for processing test input data and outputting a result of the process. Each of the macrocells is tested independently of each other and includes an input-output circuit. The input-output circuit comprises: a first holding register for holding the test input data; a selector circuit for shutting off an input path for normal operation signals to the macrocell in question at the time of testing the macrocell, selecting the test input data held in the first holding register, and outputting the selected test input data to a logic circuit to be tested in the macrocell; a second holding register for holding test output data obtained as a result of a test process carried out in the macrocell based on the test input data, and outputting the test output data externally; and a switching circuit for shutting off, at the time of testing the macrocell, an output path for normal operation signals from the microcell to other portions of the logic circuit.

9 Claims, 3 Drawing Sheets

LOGIC CIRCUIT HAVING NORMAL INPUT/OUTPUT DATA PATHS DISABLED WHEN TEST DATA IS TRANSFERRED DURING MACROCELL TESTING

BACKGROUND OF THE INVENTION

1. Field of the Invention

The present invention relates to a logic circuit, and particularly to a logic circuit employing previously prepared macrocells to enable the logic circuit to be tested easily and to enhance the feasibility of testing such a logic circuit.

2. Description of the Prior Art

In recent years, LSIs (Large Scale Integrated Circuits) based on the macrocell system have been used. These LSIs are custom LSIs. The macrocell system uses macrocells each of which is a circuit block comprising a plurality of elements such as transistors, resistors and capacitors to realize a predetermined function such as RAM and ALU operation. The macrocells are prepared in advance and registered in, for instance, a data base. The macrocells thus prepared are arranged and interwired manually or with a CAD to design and form an LSI. Compared to other conventional designing method, the macrocell system can greatly reduce the developing period and developing costs of a LSI.

As a reasonable test for a logic circuit such as an LSI, a method of supplying test data to the logic circuit and comparing the output from the logic circuit with an expected value is generally used. An example of this sort of method is the LSSD (Level Sensitive Scan Design) method. This method of testing an integrated circuit with this method will now be explained.

In testing the integrated circuit, all flip-flops (FFs) in the integrated circuit are controlled to form one continuous shift register. Input test data from a test data generating unit is passed through the shift register and supplied to a combinational logic circuit in the integrated circuit, and this combinational logic circuit is controlled to execute one cycle of operation.

An output signal from the combinational logic circuit is latched by the shift register, output from the integrated circuit via a scan signal output terminal, and compared with an expected value to judge whether or not the integrated circuit has operated according to a predetermined function.

Conventionally, the logic circuit designed and formed according to the macrocell system is tested as a whole by using, for instance, the LSSD method.

Since the circuit is tested as a whole, it is difficult to reuse test data already prepared for the individual macrocells, and so test data for the logic circuit as a whole must be newly prepared.

SUMMARY OF THE INVENTION

To solve the problem caused by this conventional technique, a first object of the present invention is to provide a logic circuit which can separate a circuit portion to be tested from other circuit portions and test the circuit portion by using already available test data for the circuit portion.

A second object of the present invention is to provide a logic circuit which can carry out one cycle of a test while receiving data to be used for the next cycle of the test, thus achieving real time test execution.

In order to accomplish the first object, the present invention provides a logic circuit comprising a plurality of macrocells and with particular a test for testing each macrocell independently. Each of the macrocells includes an input-output circuit. The input-output circuit comprises a first holding stage for holding input test data; a selector circuit for shutting off an input path for normal mode operation signals to the macrocell for which test execution for the macrocell is occurring, selecting the test input data held in the first holding stage, and outputting the selected test input data to a test object portion of the macrocell; a second holding stage for holding test output data which is the result of the test executed for the macrocell using the test input data supplied from other circuit portions of the macrocell for execution of the test for the macrocell; and a switching circuit for shutting off, for execution of the test for the macrocell, an output path for normal mode operation signals from the macrocell to other circuit portions of the logic circuit.

In order to accomplish the second object, the present invention provides a logic circuit having a plurality of macrocells. A macrocell of the logic circuit comprises an input-output circuit which comprises a first holding stage for holding a test input data, a second holding stage for storing the test input data transfered from the first storing stage, a selector circuit for intercepting, for execution of the test for the macrocell, a signal path for the input of normal mode operation signals and selecting the input test data which is stored in the second holding stage to supply the input test data to a test target circuit in the macrocell, a third holding stage for holding test output data which is a result of the test executed for the macrocell using the test input data to output the test output data apparatus external to the logic circuit, and a switch circuit for intercepting for execution of the test for the macrocell, a signal path for outputting normal mode operation signals.

These and other objects, features and advantages of the present invention will be more apparent from the following detailed description of the preferred embodiments in conjunction with the accompanying drawings.

DETAILED DESCRIPTION OF THE EMBODIMENTS

Figure 1:
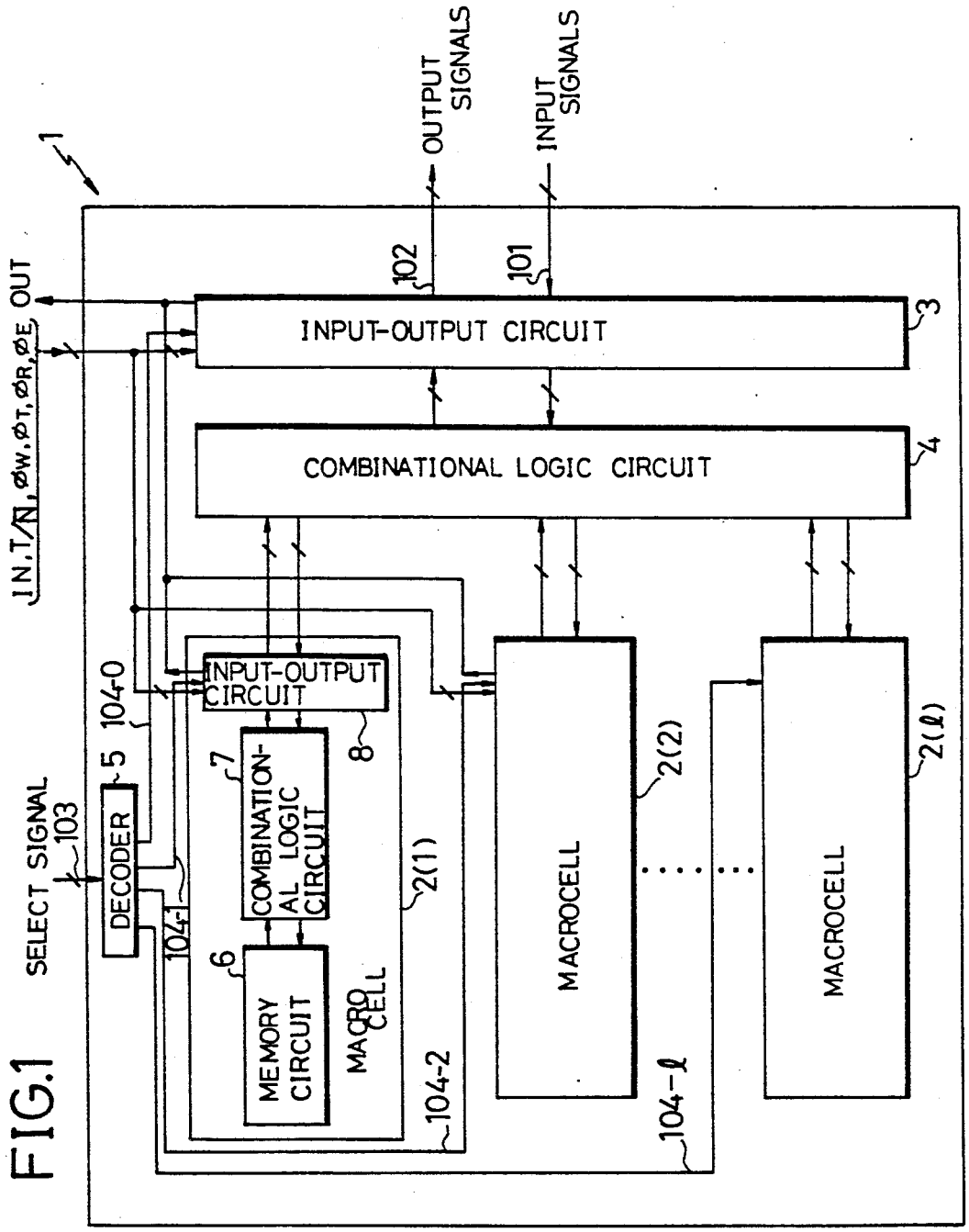
FIG. 1 is a block diagram for a logic circuit according to an embodiment of the present invention.

FIG. 1 is a block diagram showing a logic circuit 1 according to an embodiment of the present invention. In the testing mode, each macrocell can be tested independently from other circuit portions.

The logic circuit 1 of FIG. 1 has a plurality "1" of macrocells 2(1) to 2(l), an input-output circuit 3 for receiving input-signals for the logic circuit 1 and generating output-signals from the logic circuit 1, a combinational logic circuit 4 which functions as an interface between the input-output circuit 3 and the macrocells 2(1) to 2(l) and as a signal transmission path among the macrocells, and a decoder 5 for generating, in the test mode, a select signal for selecting any one of the macrocells 2(1) to 2(l) or the logic circuit 1 as a whole as the circuit to be tested.

The input-output circuit 3 receives a signal T/N that specifies a test mode or a normal operation mode, clock signals $\phi_W$, $\phi_T$, $\phi_E$ and $\phi_R$. Further, the input-output circuit 3 receives, in the test mode, test input data IN.

The macrocell 2(1) comprises a memory circuit 6 made of many FFs (flip flops), a combinational logic circuit 7 and an input-output circuit 8. Each of the other macrocells 2(2) to 2(l) has the same construction as that of the macrocell 2(1).

Under normal operation of the logic circuit 1, input signals 101 are externally supplied to the logic circuit 1, and supplied to the input-output circuit 8 in each macrocell. Input signals for a normal operation mode supplied to the input-output circuit 8 are them supplied to the memory circuit 6 via the combinational logic circuit 7. Output signals from the memory circuit 6 are supplied to the input-output circuit 8 via the combinational logic circuit 7. Output signals from the input-output circuits 8 are passed through the combinational logic circuit 4 and the input-output circuit 3 and are output as output signals 102 for the normal operation mode to apparatus external to the logic circuit 1.

Under a test mode where each macrocell 2(1) to 2(l) is tested, test input data IN are externally supplied to the logic circuit 1 and to the input-output circuit 8 of a macrocell to be tested. Then, the test input data IN is supplied to the memory circuit 6 via the combinational logic circuit 7. An output from the memory circuit 6 is supplied to the input-output circuit 8 via the combinational logic circuit 7 and is output as test output data OUT from the input-output circuit 8 to apparatus external to the logic circuit 1.

Similarly, under a test mode where the logic circuit 1 as a whole is tested, test input data IN are externally provided to the logic circuit 1 and to the input-output circuit 3. Then, the test input data IN are supplied to the respective macrocells 2(1) to 2(l) through the combinational logic circuit 4, and the output from the macrocells are output as test output data OUT through the combinational logic circuit 4 and the input-output circuit 3 to apparatus external to the logic circuit 1.

The decoder 5 receives a select signal 103 for selecting a circuit portion to be tested from apparatus external to the logic circuit 1 and decodes the select signal 103. Then the decoder 5 generates one of the decoded signals 104-0 to 104-l to specify a test object circuit among the macrocells 2(1) to 2(l) and the logic circuit 1.

When the logic circuit 1 as a whole is designated as a circuit to be tested by the select signal 103, the decoder 5 outputs a decoded signal 104-0 of signal value 1 to the input-output circuit 3. When the macrocell 2(i) (i=1, 2, ..., l) is designated as a circuit to be tested by the select signal 103, the decoder 5 outputs a signal 104-i of value 1 to the input-output circuit 8 of the macrocell 2(i) to be tested.

Under the test mode, when the logic circuit 1 is designated as a test object circuit and the input-output circuit 3 receives the signal 104-0 of logical value 1, the input-output circuit 3 separates the logic circuit 1 from the other circuit portions, receives test input data IN, and outputs the result of a process carried out in the logic circuit 1 on the test input data IN as test output data OUT.

Similarly, when the macrocell 2(i) is designated as a test object circuit and the input-output circuit 8 of the macrocell 2(i) receives the signal 104-i of logical value 1 under the test mode, the input-output circuit 8 seperates this macrocell 2(i) from the other remaining circuits, transmits the test input data IN to the test object portion in the macrocell 2(i) consists of combinational logic circuit 7 and memory circuit 6, and outputs the result of the operation carried out in the macrocell 2(i) on the test input data IN as test output data OUT.

The details of the input-output circuits 3 and 8 will now be described.

Figure 2:
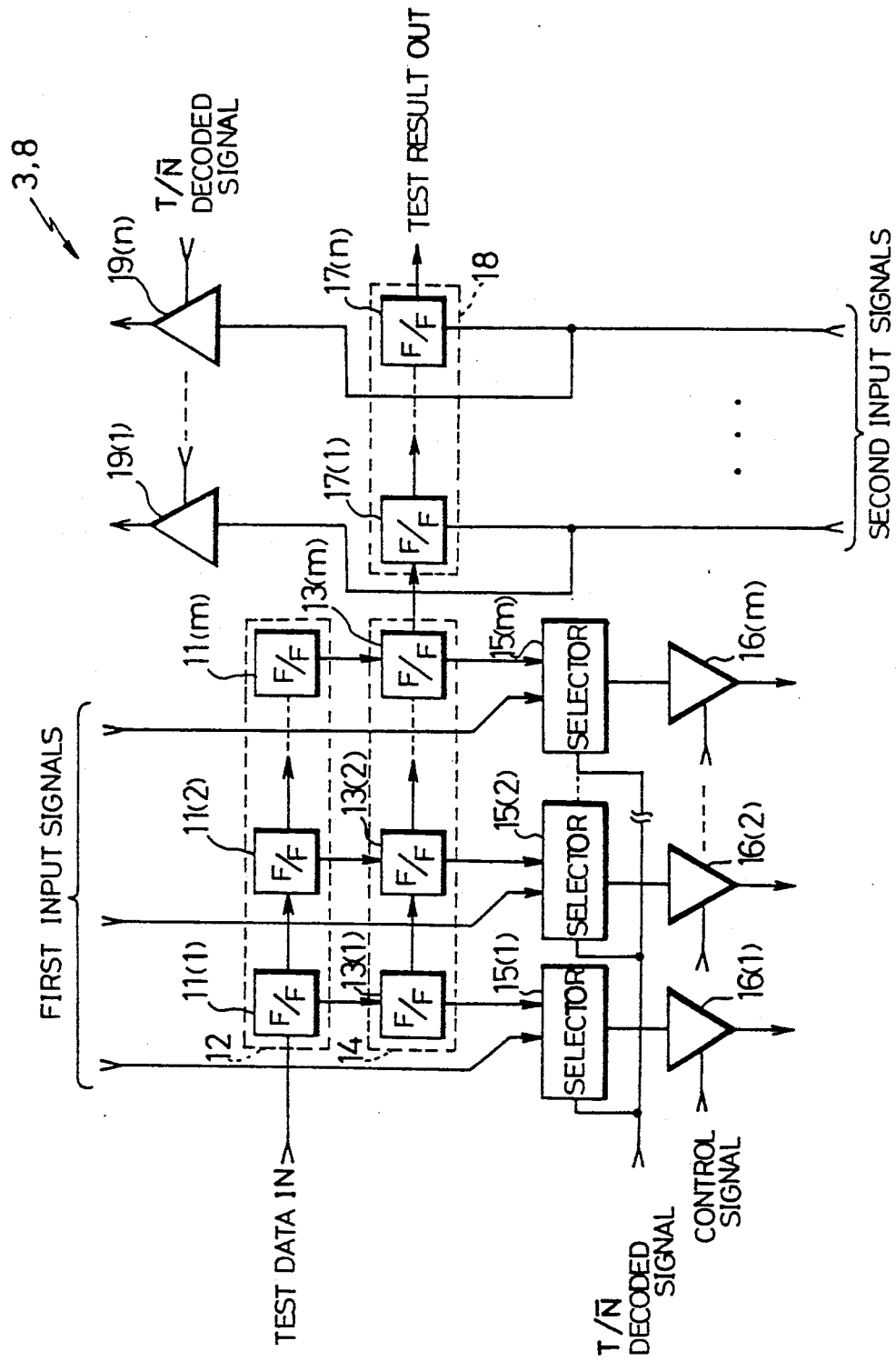
FIG. 2 is a circuit diagram showing the details of an input-output circuit of the logic circuit shown in FIG. 1.

FIG. 2 is a view showing the details of one of the input-output circuits 3 or 8. The other input-output circuits are similarly constructed.

Flip-flops FF 11(1) to FF 11(m) constitute a shift register 12. The number "m" of the stages of the shift register 12 is equal to the number of bits of a first input signal. For the input-output circuit 3, the first input signal is the input signal 101 externally input to the logic circuit 1. For the input-output circuit 8, the first input signal is a normal operation mode output signal of the combinational logic circuit 4. Under the test mode the test input data IN are sequentially set to the FFs 11(1) to 11(m), in synchronism with the write clock signal $\phi_W$ shown in FIG. 3.

Flip-flops FF 13(1) to FF 13(m) form a shift register 14. Under the test mode each bit value of the test input data IN held in the FF 11(i) is transferred to each FF 13(i) and stored therein in synchronism with the transfer clock signal $\phi_T$ shown in FIG. 3. The test input data IN written in the shift register 14 are sequentially read out thereof in synchronism with the read clock signal $\phi_R$ shown in FIG. 3.

Each of the input-output circuits 3 and 8 has "m" number of selectors 15(1) to 15(m). Each selector 15(i) receives an "i"th bit of the first input signal as well as an output of the FF 13(i). The selector 15(i) selects and outputs the output of the FF 13(i) when the macrocell 2(i) or the logic circuit 1 is designated as a test object circuit and the decoded signal 104-i of logical value 1 is input to the input-output circuit of macrocell 2(i) or of the logic circuit 1 under the test mode. In other cases, the selector 15(i) selects the "i"th bit of the first input signal. The "i"th bit of the first input signal or the output of the FF 13(i) thus selected is supplied to a buffer circuit 16(i).

The buffer circuits 16(1) to 16(m) either output, after amplification or block the signals supplied from the respective selectors, according to a control signal generated in a control signal generating portion (not shown).

A plurality "n" of FFs 17(1) to 17(n) constitute a shift register 18. The number "n" of stages of the shift register 18 is equal to the bit width of a second input signal. For the input-output circuit 3, the second input signal is an output signal of the combinational logic circuit 4. For the input-output circuit 8, the second input signal is an output signal of the combinational logic circuit 7. The FF 17(1) in the first stage of the shift register 18 is connected to the FF 13(m) in the last stage of the shift register 14.

Figure 3:
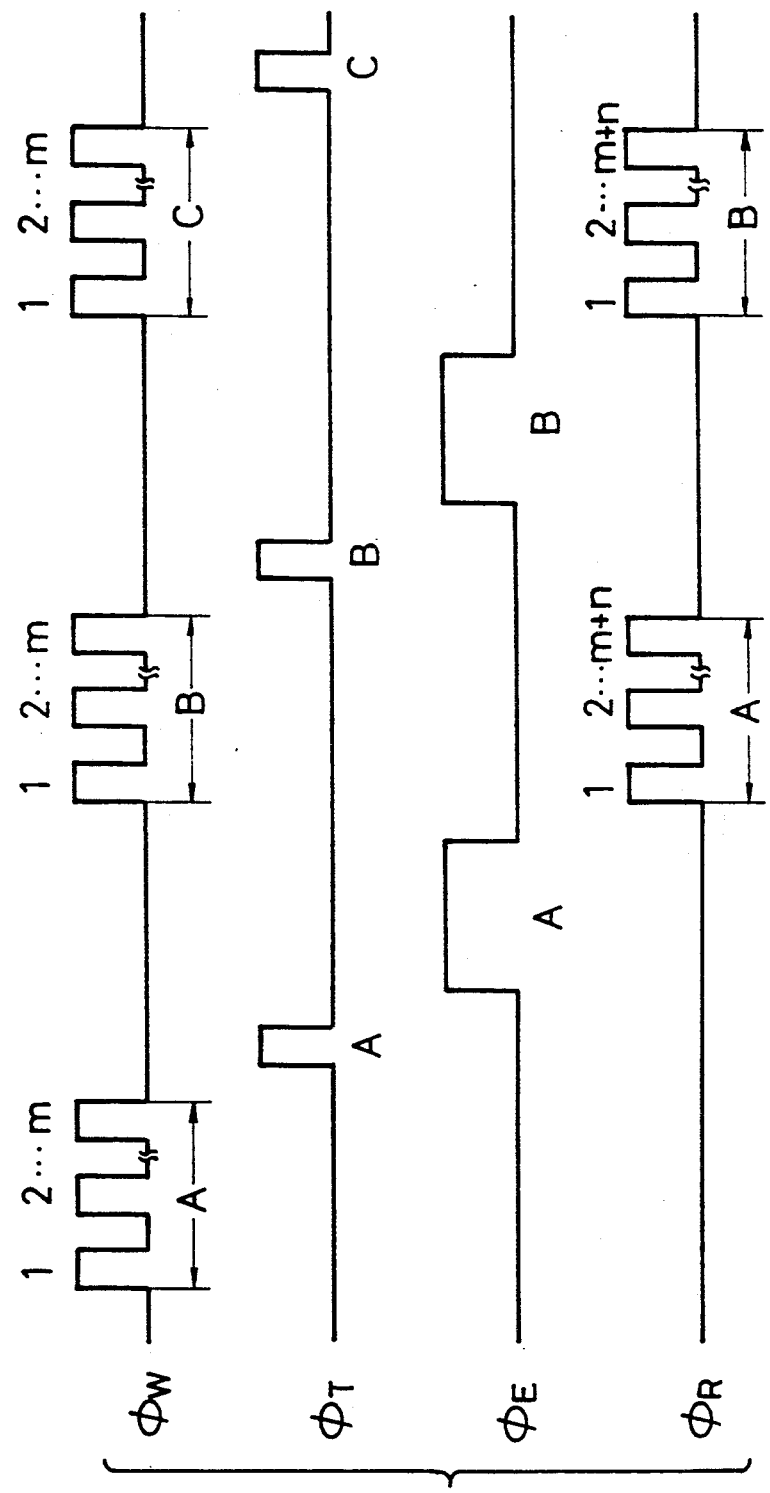
FIG. 3 is a set of timing charts of clock signals used in the logic circuit shown in FIG. 1.

The second input signal is set in the FFs 17(l) to 17(n) under the test mode in synchonism with the execution clock signal $\phi_E$ shown in FIG. 3. And under the test mode, the shift registers 14 and 18 operate as one continuous shift register, items of information held in the shift registers 14 and 18 are output as the test output data OUT in synchronism with the read clock signal $\phi_R$ shown in FIG. 3.

Each of the input-output circuits 3 and 8 is provided with buffer circuits 19(1) to 19(n). The buffer circuits 19(1) to 19(n) receive the decoded signal, and their internal conditions are controlled by the decoded signal. That is when a decoded signal of logical value 1 is input under the test mode, each buffer circuit is put in a high-impedance state to separate the logic circuit 1 or the macrocell, as a test object circuit, from other circuit portions. In other cases, the buffer circuits of the input-output circuit 3 output the second input signal as the output signal 102 to external apparatus, and the buffer circuits of the input-output circuit 8 output the second input signal to the combinational logic circuit 4.

In the above statements, the input-output circuit 3 of the logic circuit 1 and the input-output circuit 8 of each macrocell have been explained in parallel, and distinction between the two kinds of the input-output circuits was not explicitly pointed out for the convenience of explanation. However, they have incidental differences of course. For example, the bit widths of first input signals thereof generally differ from each other.

Operation of the logic circuit of the above-mentioned arrangement now will be described.

Firstly, the case of testing the logic circuit 1 as a whole will be explained.

To put the logic circuit 1 in the test mode, the decoded signal 104-0 of logical value 1 is supplied to the input-output circuit 3, the logic circuit being designated as a circuit to be tested. The "m" bits of the test input data IN are set in the shift register 12 of the input-output circuit 3 in order and in synchronism with "m" pulses of the clock $\phi_W$ indicated with an "A" on the top timing chart of FIG. 3. Then the test input data IN is transferred to the shift register 14 in synchronism with a pulse of the transfer clock $\phi_T$ as indicated with an "A" on the second timing chart of FIG. 3. In this case, the test is entirely for checking the operation of the input-output circuit 3 and combinational logic circuit 4. Therefore, much smaller numbers for the test input data IN are needed than in the case when a respective macrocell is selected as a test object circuit.

The test input data IN transferred to the shift register 14 is supplied to the combinational logic circuit 4 via the selectors 15(1) to 15(m) and buffer circuits 16(1) to 16(m). The test input data IN supplied to the combinational logic circuit 4 is supplied to the input-output circuits 8 of the respective macrocells. And in synchronism with a pulse of the execution clock $\phi_E$ incicated with an "A" on the third timing chart of FIG. 3, the logic circuit 1 is operated with the test input data IN for one cycle. Thus, one cycle of the test is executed.

After the completion of a cycle of the test, a result of the cycle is set in the shift register 18 at the fall of a pulse of the clock $\phi_E$ indicated with an "A" in FIG. 3.

The test result set in the shift register 18 is output as test output data OUT together with input data IN set in the shift register 14 to apparatus external to the logic circuit 1 in synchronism with pulses of the read clock $\phi_R$ indicated with an "A" on the fourth timing chart of FIG. 3.

While one cycle of operation of the logic circuit 1 is being carried out with the test data which was set in the shift register 14 in synchronism with the pulse of the transfer clock signal $\phi_T$ indicated with an "A" on the second timing chart of FIG. 3, test input data IN to be used in the next test cycle is set in the shift register 12 in synchronism with pulses of the write clock $\phi_W$ indicated with a "B" on the top timing chart of FIG. 3. As a result, the test can be carried out in real time to shorten the total testing time.

Further, by connecting the FFs 17(l) to 17(n) to form a linear feedback shift register (LFSR), GO/NO-GO test to judge whether a product is acceptable or not can be carried out effectively.

The case where each macrocell 2(i) is tested independently will now be explained.

In this case, a decoded signal 104-i of logical value 1 is provided to the macrocell 2(i) to be tested. Then, each selector 15(i) in the input-output circuit 8 of the macrocell 2(i) selects the output of each FF 13(i) as its output, and the buffer circuits 19(l) to 19(n) are put in a high-impedance state. Therefore, the macrocell 2(i) to be tested is separated from the other circuit portions.

Under such conditions, the test input data IN is set from apparatus external to the logic circuit 1 to the shift register 12 of the input-output circuit 8 in synchronism with the write clock signal $\phi_W$. After that, the test is executed for the specified macrocell 2(i), similar to the above stated test for the logic circuit 1 as a whole.

In this way, each macrocell can be tested independently of each other. Therefore, a set of test data prepared for the respective macrocells in advance can be used in testing the logic circuit 1, thus eliminating the necessity of newly preparing test data. As a result, the developing period for the logic circuit 1 can be remarkably reduced, and the development cost is greatly reduced. Further, testing time can be greatly shortened since the test is carried out in real time.

The logic circuit 1 itself may be used as a macrocell of a larger scale logic circuit. In this case, a select signal supplied to the decoder 5 can be set to a predetermined value to specify the logic circuit 1 as a circuit to be tested. Thus, the logic circuit 1 as a macrocell can be tested independently of the other circuits.

Therefore, with the present invention it becomes possible to offer any scale of a logic circuit with an enhanced test feasibility systematically. And by combining a plurality of such logic circuits, a larger scale logic circuit with enhanced test feasibility can be realized easily.

While the invention has been described in its preferred embodiments, it is to be understood that the words which have been used are words of description rather than limitation and that various changes and modifications may be made within the purview of the appended claims without departing from the true scope and spirit of the invention in its broader aspects.

For instance, if the number of macrocells of the logic circuit 1 is not great, the decoder may be omitted, and each test object macrocell can be directly designated by a select signal which is supplied from apparatus external to the logic circuit 1.

When it is not necessary to read out the test input data IN transferred to and set in the FFs 13(l) to 13(m), the FFs 13(l) to 13(m) may not be needed to be formed into a shift register.

Further, when only a final result is needed and intermediate results are not needed, there is no need for reading out the contents of FF 17(l) to 17(R) in each cycle of the execution clock signal $\phi_E$. In such a case where, for example, a test is executed as summation over a great deal of data, it suffices to execute the test in a sequence by first repeating the steps of inputting test input data and executing the test a predetermined number of times according to the write clock signal $\phi_W$, transfer clock signal $\phi_T$, and execution clock signal $\phi_E$, and next reading out the final result according to the read clock signal $\phi_R$.

It is also possible to omit the shift register 14 in the logic circuit 1. In this case, although a real time test is no longer possible, still it is possible to separate the test object circuit from the other remaining circuits and test it independently.

Still further, when it is not necessary to set values of the second input signals in FF 17(*l*) to 17(*n*) in normal operation, it is possible to dispose n switches on the signal paths of the second input signals before respective FF 17(*l*) to 17(*n*), and turn-off them in normal operation.

Thus, the invention provides a logic circuit which is constructed from plural macrocells, and in which each macrocell can be tested independently. For the test of a logic circuit of the present invention, it is possible to use the test data which has already been obtained for each macrocell of the logic circuit. Thus the labor of obtaining new test data is no longer needed, and so the time and cost required for the development of a logic circuit is greatly reduced.

With the present invention includes a logic circuit in which a test cycle is executed, test input data which is used in the next cycle is input, and a test is executed in real time. Thus this logic circuit has a more enhanced for testing feasibility.

What is claimed is:

1. A logic circuit capable of operation in a test execution mode and in a normal operating mode, said logic circuit comprising:
    an operational circuit for providing normal operating mode input signals;
    a plurality of macrocell means for producing normal operating mode output signals;
    input path means for transferring said normal operating mode input signals to said plurality of macrocell means; and
    output path means for transferring said normal operating mode output signals to said operational circuit;
    each of said macrocell means being capable of being independently tested and having a test object portion and input-output circuit means for inputting input test data and for outputting output test data in said test execution mode, said input-output circuit means including
    first holding means for holding said input test data,
    selector circuit means for shutting off said input path means in said test execution mode, for selecting said input test input data from said first holding means and for outputting said input test data to said test object portion,
    said test object portion responding to said input test data to perform a test execution and produce said output test data as a result thereof,
    second holding means for holding said output test data and outputting said output test data externally of said macrocell means, and
    switching circuit means for shutting off said output path means in said test execution mode.

2. The logic circuit of claim 1, which further comprises:
    additional input path means for transferring said normal operating mode input signals to said logic circuit;
    additional output path means for transferring said normal operating mode output signals from said logic circuit;
    additional input-output circuit means for inputting said input test data and for outputting said output test data in said test execution mode, said additional input-output circuit means including
    additional first holding means for holding said input test data,
    additional selector circuit means for shutting off said additional input path means in said test execution mode, for selecting said input test data from said additional first holding means and to outputting said test input data to an additional test object portion in said logic circuit,
    said additional test object portion responding to said input test data to perform a test execution and produce said output test data as a result thereof,
    additional second holding means for holding said output test data and outputting said output test data externally of said logic circuit, and
    additional switching circuit means for shutting off said additional output path means in said test execution mode,
    said logic circuit being capable of being independently tested.

3. The logic circuit of claim 1, wherein said first and the said second holding means each include a shift register, respectively.

4. The logic circuit of claim 1, which further comprises: decoder means for receiving a select signal for selecting a particular macrocell means to be tested, decoding said select signal, and supplying a decoded select signal to said input-output circuit means of said particular macrocell means to be tested.

5. A logic circuit capable of operation in a test execution mode and in a normal operating mode, said logic circuit comprising:
    an operational circuit for providing normal operating mode input signals;
    a plurality of macrocell means for producing normal operating mode output signals;
    input path means for transferring said normal operating mode input signals to said plurality of macrocell means; and
    output path means for transferring said normal operating mode output signals to said operational circuit;
    each of said microcell means being capable of being independently tested and having a test object portion and input-output circuit means for inputting input test data and for outputting output test data in said test execution mode, said input-output circuit means including
    first holding means for holding and transferring said input test data,
    second holding means for holding said input test data transferred from said first holding means,
    selector circuit means for shutting off said input path means in said test execution mode, for selecting said input test data from said second holding means and for outputting said input test data to said test object portion,
    said test object portion responding to said input test data to perform a test execution and produce said output test data as a result thereof,
    third holding means for holding said output test data and outputting said output test data externally of said macrocell means, and
    switching circuit means for shutting off said output path means in said test execution mode.

6. The logic circuit of claim 5, wherein said first, said second and said third holding means each include a shift register, respectively, and a second shift register constituting said second holding means is connected to a third shift register constituting said third holding means in series to output said output test data as well as said input test data.

7. The logic circuit of claim 5, wherein said first and third holding means each include a shift register, respectively.

8. The logic circuit of claim 5, which further comprises: decoder means for receiving a select signal for selecting a macrocell means to be tested, decoding said select signal, and supplying said decoded select signal to said input-output circuit means of said macrocell means to be tested.

9. In an integrated logic circuit, having a test mode and a normal operating mode, comprising:
   a plurality of macrocells and
   input-output means coupled with said macrocells for enabling signal exchange between said macrocells and a circuit external to said logic circuit;
   each of said macrocells comprising an input-output circuit connected with said input-output means and an operational circuit,
   said input-output circuit comprising first holding means for receiving and holding test data,
   selector means connected at its input terminals with said first holding means and said input-output means and connected at its output terminals with said operational circuit, said selector means being controlled to output as output signals said test data held in said first holding means or signals of said input-output means by a control signal indicative of selection of a macrocell to be subjected to a current test operation in said test mode,
   second holding means connected with said operational circuit for holding signals outputted from said operational circuit responsive to said output signals from said selector means,
   wherein said selector means of each said macrocell outputs said signals from said input-output means in said normal operating mode and said selector means of said macrocell subjected to said current test operation outputs test data maintained in said first holding means in said test mode.

10. The logic circuit of claim 9, wherein each of said macrocells further comprises third holding means connected with said first holding means in order to receive and store said test data transferred from said first holding means.

* * * * *